United States Patent [19]

Bottomley

[11] Patent Number: 4,733,185

[45] Date of Patent: Mar. 22, 1988

[54] METHODS FOR LOCALIZATION IN NMR SPECTROSCOPY

[75] Inventor: Paul A. Bottomley, Clifton Park, N.Y.

[73] Assignee: General Electric Company, Schenectady, N.Y.

[21] Appl. No.: 56,513

[22] Filed: Jun. 1, 1987

[51] Int. Cl.$^4$ ............................................. G01R 33/20
[52] U.S. Cl. ..................................... 324/309; 324/307
[58] Field of Search ........................ 324/300, 307, 309; 128/653

[56] References Cited

U.S. PATENT DOCUMENTS

| | | | |
|---|---|---|---|
| 4,581,582 | 4/1986 | Redington | 324/309 |
| 4,616,182 | 10/1986 | Kramer | 324/309 |
| 4,618,827 | 10/1986 | Redington | 324/309 |
| 4,628,262 | 12/1986 | Maudsley | 324/307 |
| 4,639,671 | 1/1987 | Macovski | 324/306 |
| 4,654,595 | 3/1987 | Sepponen | 324/307 |
| 4,665,367 | 5/1987 | Kramer | 324/309 |
| 4,678,995 | 7/1987 | Avison | 324/312 |
| 4,689,563 | 8/1987 | Bottomley | 324/309 |
| 4,689,564 | 8/1987 | Leue | 324/312 |
| 4,694,254 | 9/1987 | Vatis et al. | 324/309 |

OTHER PUBLICATIONS

W. P. Aue, S. Muller, T. A. Cross & J. Seelig, "Volume-Selective Excitation. A Novel Approach to Topical NMR", *Journal of Magnetic Resonance*, vol. 67, 1986, pp. 350-354.
P. Luyten, J. H. Marien, B. Sijtsma, J. A. Den Hollander, "Solvent-Suppressed Spatially Resolved Spectroscopy. An Approach to High-Resolution NMR on a Whole-Body MR System", *Journal of Magnetic Resonance*, vol. 67, 1986, pp. 148-155.
R. J. Ordidge, A. Connelly, J. A. B. Lohman, "Image-Selected in Vivo Spectroscopy (ISIS). A New Technique for Spatially Selective NMR Spectroscopy", *Journal of Magnetic Resonance*, vol. 66, 1986, pp. 283-294.

*Primary Examiner*—Michael J. Tokar
*Attorney, Agent, or Firm*—Geoffrey H. Krauss; James C. Davis, Jr.; Marvin Snyder

[57] ABSTRACT

A method for acquiring an NMR spectroscopy response signal from a portion of a sample located in a voxel at the junction of three planar surfaces, each in a plane at an angle to the planes of the other two surfaces, first excites the sample with a localization subsequence which selects values for the surfaces in only two of the three dimensions, to evoke a chemical-shift spectrum from voxels substantially along a line at the junction of the two selected planes; and then provides a readout subsequence including a NMR signal portion spatially-selective in the third dimension and selected to limit the received spectroscopy response signal substantially to the voxel of interest. Any necessary cycling of sequences to improve spatial localization is provided in the two dimensions of the preliminary localization subsequence; phase cycling or alternation is not used in the selective RF pulse of the data acquisition subsequence. The methods provide improvements in immunity to localization artifacts, as may be produced physiological motion, or by NMR relaxation between the localization and read-out subsequences.

27 Claims, 8 Drawing Figures

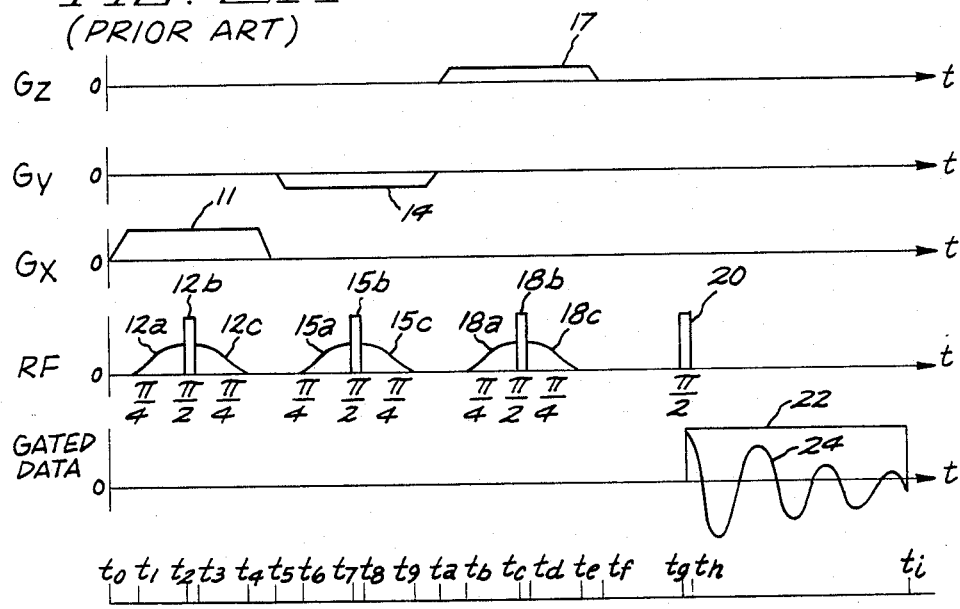
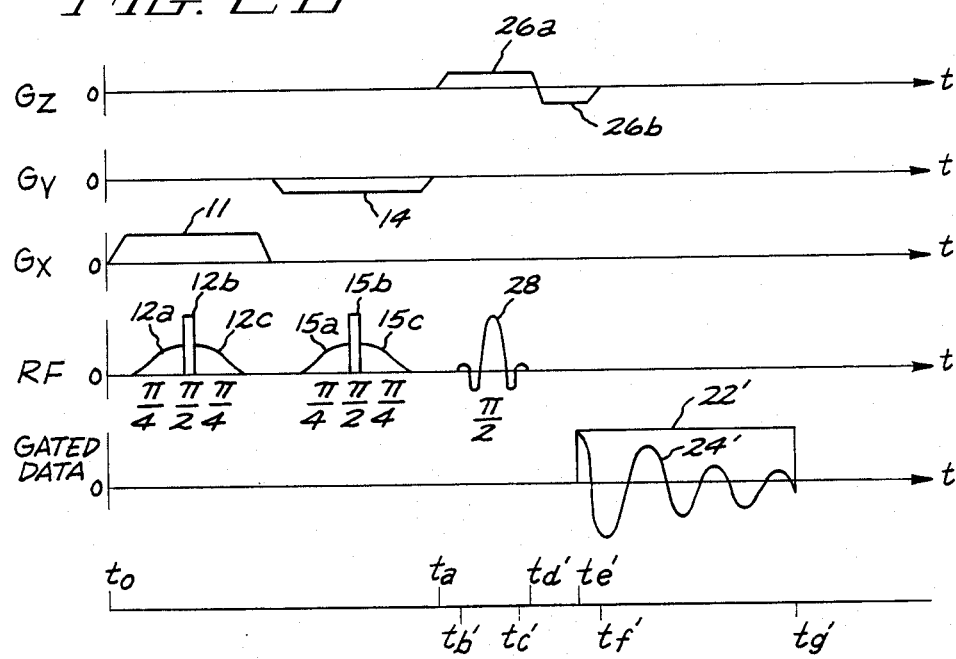

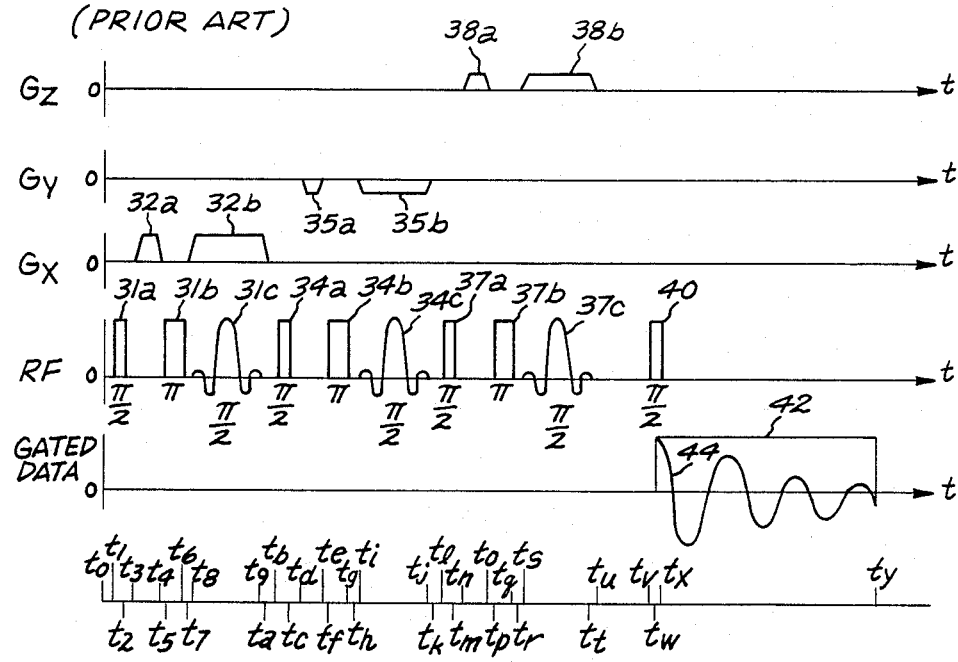
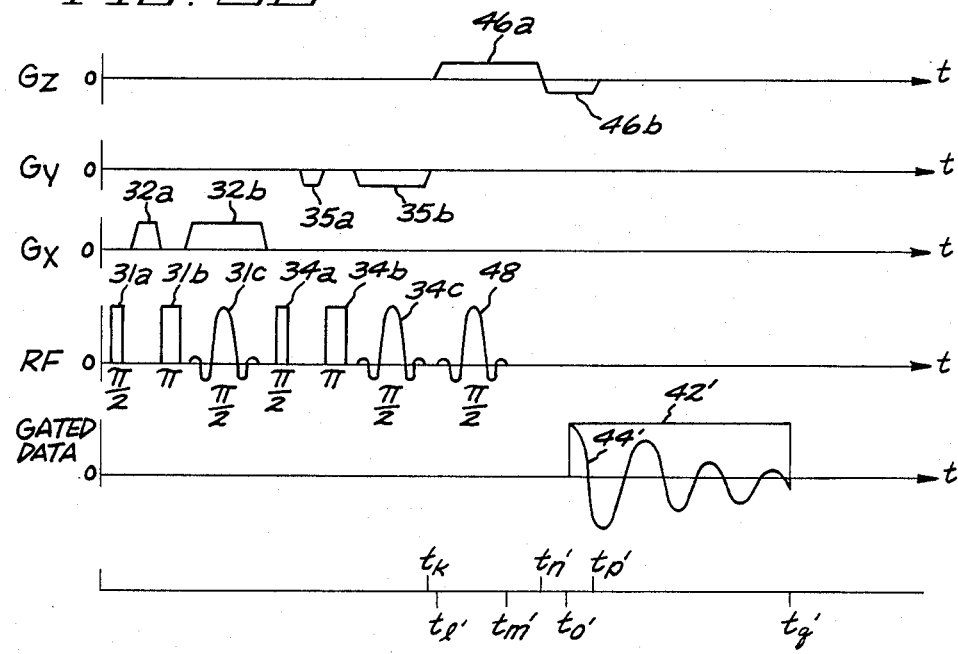

METHODS FOR LOCALIZATION IN NMR SPECTROSCOPY

BACKGROUND OF THE INVENTION

The present invention relates to nuclear magnetic resonance (NMR) spectroscopy and, more particularly, to improved methods for voxel localization in NMR spectroscopy procedures by use of a two-dimensional localization subsequence followed by a readout subsequence with a spatially-selective readout pulse for localization in the third of the three orthogonal dimensions.

It is highly desirable to be able to obtain high-resolution NMR spectra from a restricted region within a living organism, such as a human being and the like. Various detailed in vivo studies of molecular structure, concentration, metabolism, and the like, are possible if a volume element (voxel) can be precisely selected from a complex three dimensional sample. It is not only necessary to provide the voxel with well-defined boundaries, within which maximized sensitivity is present, but also to allow the selective volume to be easily moved within the sample. One common voxel-localization method is by restriction of the radio-frequency (RF) magnetic $B_1$ field via the use of a RF surface coil; unfortunately, the sensitivity of the surface coil tends to be relatively coarse and maximized close to the surface of the sample. In any event, a highly desirable procedure presently appears to be: acquisition of an overall $^1H$ image of the general volume of the sample; and electronic selection of the exact voxel, within that general volume, at which high-definition spectra are to be obtained. Unfortunately, many presently available techniques for achieving exact voxel selection, in spectral analysis, are highly susceptible to signal artifacts produced either by spurious physiological motion of the sample, during the sequence cycle, or by NMR relaxation occurring within a single acquisition sequence. The present invention is concerned with improved methods for spectral acquisition with volume localization and significant reduction of NMR signal artifacts.

PRIOR ART

One of the earliest techniques for obtaining three-dimensional spatially-resolved NMR chemical-shift spectra without utilizing a volume-restrictive antenna, was described in "Volume-Selective Excitation: A Novel Approach to Typical NMR" (W. P. Aue et al., 56 J. Mag. Reson. 350-354 (1984)), in which localization in each of the three orthogonal axial directions of a Cartesian coordinate system is brought about by a continuous string of three RF pulses (respectively a first 45°, or $\pi/4$, selective pulse; a 90°, or $\pi/2$, broadband, non-selective pulse; and a second 45° selective pulse) all about the same axis and all in the presence of a magnetic field gradient $G_d$ in that axial direction. Each one of the triplet of one-dimensional processes preserves the Z-axis magnetization in that selected plane orthogonal to the direction of the $B_0$ gradient, while producing transverse magnetization elsewhere within the general volume. Thus, after a localization subsequence of three such localization steps, only that voxel common to the three orthogonal selected planes contains negative Z magnetization, which is then observed with a readout subsequence having normal broadband 90° RF signal pulse. The VSE technique is difficult to implement in vivo on large-scale body systems, because non-selective broadband RF pulses cannot be easily applied in the presence of a large gradient field, without the use of impractical RF power levels.

Another technique, based upon the same principal as the VSE localization subsequence, is the SPARS method described in "Solvent-Suppressed Spatially Resolved Spectroscopy An Approach to High-Resolution NMR on a Whole-Body MR System" (P. R. Luyten et al., 67 J. Mag. Reson. 148-155 (1986)), wherein the VSE pulse scheme is modified to avoid the use of short, intense non-selective RF pulses during application of the magnetic field gradients. Each one-dimensional SPARS localization portion of the localization subsequence again uses three sequential RF pulses. The first pulse is a non-selective 90°, or $\pi/2$, pulse, which is followed by a pulsed magnetic field gradient applied in the desired localization direction; after the removal of this gradient, a non-selective 180°, or $\pi$, refocussing RF pulse is applied, prior to application of a spatially-selective 90°, or $\pi/2$, RF pulse which is applied in the presence of a second pulsed gradient, in the same direction as the first gradient. After the application of three of these one-dimensional localization portions is completed to end the three-dimensional localization subsequence, the NMR readout (or response observation) subsequence commences with a non-selective $\pi/2$ RF signal pulse. This SPARS technique is more susceptible than the VSE technique, to losses in NMR signal strength due to $T_2$ relaxation, because each of the SPARS one-dimensional localization subsequences is typically of significantly greater duration than each one-dimensional localization subsequence, as the SPARS NMR pulses are double the value of the VSE pulses, and additional time is needed of gradient rise and decay times in SPARS.

Moreover, a major problem with both the VSE sequence and its derivative SPARS sequence is a loss of spatial resolution due to $T_1$ relaxation between the time that the localized voxel is prepared and the later time of subsequent readout of the signal from that voxel, utilizing the final non-selective 90° NMR RF pulse. As an example, consider the use of a single VSE sequence for acquisition of a $^{31}P$ spectrum from even a relatively small $10\times10\times10$ array of voxels in a sample. If the sequence is designed to spatially resolve adenosine triphosphate (ATP), having a $T_1$ of about 1 second, and the sequence itself has a 10 millisecond preparation delay period, then the detected spectrum would contain approximately an order of magnitude greater signal from outside the selected voxel then from within that voxel. This is because, even though the longitudinal NMR magnetization of ATP from outside the selected voxel recovers only 1% in 10 ms. due to $T_1$ relaxation, this magnetization is nevertheless derived from a volume which is three orders of magnitude ($1000\times$) greater. Thus, in order to overcome this severe problem, it is often necessary to cycle either a VSE sequence or a SPARS sequence through eight or more different phase-cycling steps, while performing appropriate additive-subtractive operations on the sequence results, to obtain the desired degree of localization in a manner analogous to that used in the ISIS technique, described hereinbelow. Of course, this requires that the voxel, from which the in vivo spectrum is to be derived, be maintained exactly at the intersection of the three substantially-mutually-orthogonal spatial-localization planes isolated by each of the one-dimensional localization subsequences during the entire course of the sequence cycle. Maintaining the selected voxel motionless for extended time intervals is often extremely dificult in living samples subject to irregular and regular physiologic motions. The effect of motion is to add to the detected signal an artifactual NMR signal from outside the selected volume. The proportion of such artifactual signals, present in the observed voxel signal, increases as the selected voxel size decreases, i.e., as the resolution improves.

In a third, ISIS procedure, described in "Image Selected In Vivo Spectroscopy (ISIS). A New Technique for Spatially Selective NMR Spectroscopy" (R. J. Ordidge et al., 66 J. Mag. Reson. 283–294 (1986)), localization in each of the three orthogonal directions is carried out with a selective 180° RF signal pulse applied in the presence of one of the three orthogonal gradients. The localization subsequence is followed by a magnet stabilization delay interval, before the response observation subsequence occurs, again using a non-selective 90° RF pulse prior to response NMR signal acquisition. Because application of 180° RF pulses in this manner can only leave the magnetization inverted or non-inverted prior to readout, complete three-dimensional localization in ISIS requires repeated application of the entire sequence, including readout, for $2^3 = 8$ times, corresponding to the 8 combinations of 3 selective pulses, with each pulse being controlled to be either ON or OFF. The NMR signal from the selected voxel is then reconstructed by appropriate addition and subtraction of the 8 different readout signals that are derived from the entire volume with selectively inverted and non-inverted signal components. Since each of these eight sequence signal contributions consists of integrated signals emanating from the entire sample, as opposed to the selected voxel, the amount of undesired excited signal present at any time is orders of magnitude larger than the desired signal. This technique is therefore highly susceptible to artifacts produced by any irregular physiological motion that might occur during the eight-cycle sequence.

In general, any localization scheme (e.g., VSE, SPARS, and the like) that uses pre-selective excitation at a time interval T prior to a readout non-selective excitation will add unlocalized signals to the selected voxel signal at a rate of $(n[1-\exp(-T/T_1)]/100)\%$, where n is the ratio of the entire sample volume to the pixel volume that is selectively excited. Similarly, localization techniques (e.g. ISIS, cycled VSE, cycled SPARS, and the like) of the type that require repeated sequence applications, with the addition and subtraction of resultant NMR signals are susceptible to motional artifacts which will occur with a probability proportional to the total sequence cycle time and will produce an artifactual signal which is proportional to n. In each case, it is evident that the deleterious effects of these localization artifacts are exacerbated by the volume factor n (equal to the ratio of the total excited NMR sample volume to the selected voxel volume) whenever a non-selective volume-irradiating NMR readout pulse is employed.

Many similar techniques, such as SPACE, DIGGER, LOCUS, VOSY and the like, as described by D. M. Doddrell et al., in 68 J. Magn. Reson. 367 (1986), 70 J. Magn. Reson. 319 (1986), 3 Magn. Reson. Med. 970 (1986), A. Haase in 3 Magn. Reson. Med. 963 (1986) and the like, are of similar basic form to those described above and can be improved by my novel methods. It is therefore highly desirable to provide an improved method for spatial localization in NMR in vivo spectroscopy, and especially for any spectroscopy localiztion sequence that consists of a first spatially-localizing subsequence followed by a non-selective NMR readout subsequence.

BRIEF SUMMARY OF THE INVENTION

In accordance with the invention, a method for acquiring an NMR spectroscopy response signal from a portion of a sample located in a voxel at the junction of three planar surfaces, each in a plane at an angle to the planes of the other two surfaces, comprises the steps of: exciting the sample with a localization subsequence which selects values for the surfaces in only two of the three dimensions, to evoke a chemical-shift spectrum from voxels substantially along a line at the junction of the two selected planes; and then providing a readout subsequence including a NMR signal portion spatially-selective in the third dimension and selected to limit the received spectroscopy response signal substantially to the voxel of interest.

In presently preferred embodiments of my novel method for spatial localization, a Cartesian coordinate system is used. Any necessary cycling of sequences is provided in the two dimensions of the preliminary localization subsequence; cycling or phase-alternation is not used in the selective RF pulse of the data acquisition subsequence.

Accordingly, it is an object of the present invention to provide an improved method for voxel localization in NMR spectroscopy.

This and other objects of the present invention will become apparent upon a reading of the following detailed description, when considered in conjunction with the appended drawings.

BRIEF DESCRIPTION OF THE DRAWINGS

FIGS. 2A, 3A and 4A are graphed sets of time-related magnetic field gradient, RF and gated data response signals for the prior art respective VSE, SPARS and ISIS procedures; and FIGS. 2B, 3B and 4B are graphed sets of time-related magnetic field gradient RF and gated data signals for the improved NMR spectroscopy methods of the present invention.

DETAILED DESCRIPTION OF THE INVENTION

Figure 1:
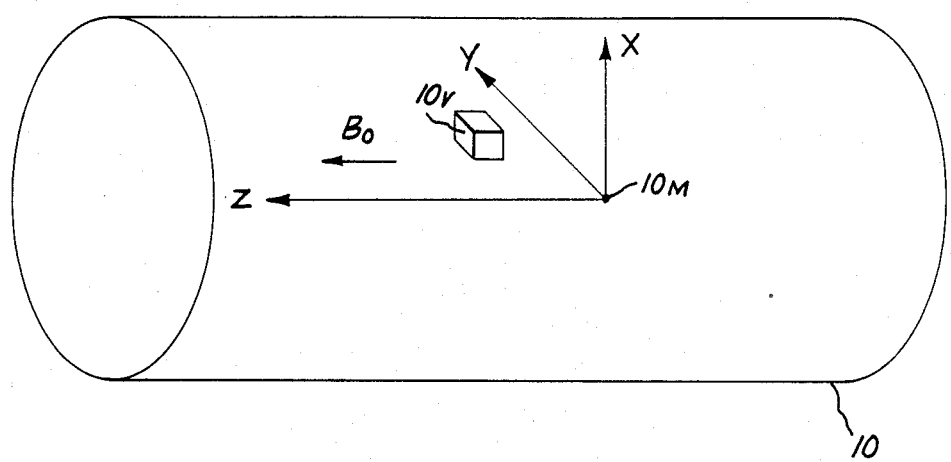
FIG. 1 is an oblique view of the cylindrical bore of a NMR imaging/spectroscopy system, and useful in defining terms and directions.
Figure 1A:
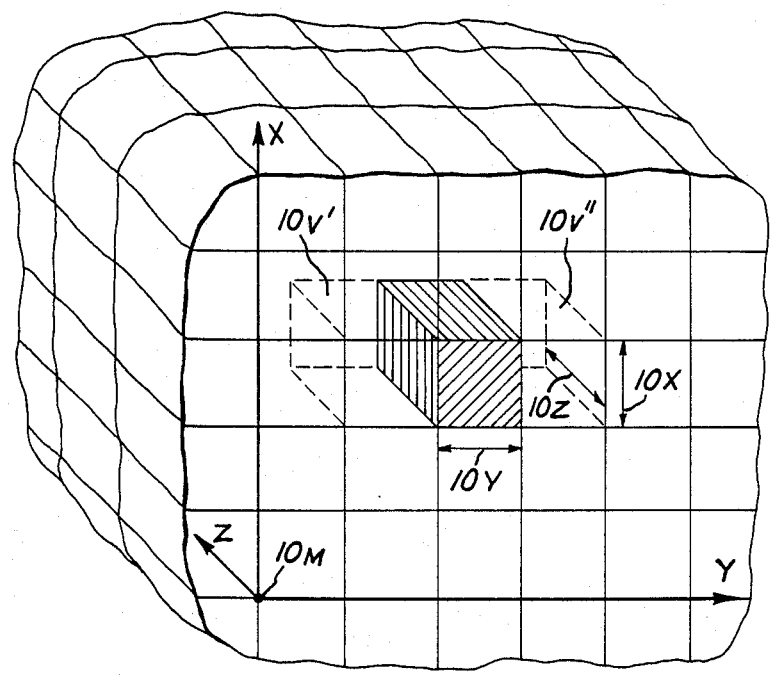
FIG. 1A is an oblique view of a portion of the imaging volume of FIG. 1, illustrating the selection of a voxel, in more detail.

Referring initially to FIGS. 1 and 1A, a NMR imaging/spectroscopy system, of type well known to the art, has a room-temperature free bore 10 in which a static magnetic field $B_O$ exists. By convention, this field is positioned parallel to the Z axis of a Cartesian coordinate system, having the magnet bore cylinder 10 axially aligned therewith. Chemical-shift spectra from a volume element (voxel) 10v is desired. Voxel 10v is located at a position (x, y, z), with respect to the center point 10m of the imaging volume. Voxel 10v is ideally of rectangular solid shape, having a dimension 10x in the direction parallel to the X axis, a dimension 10y in the direction parallel to the Y and a dimension 10z in the direction parallel to the Z axis. Illustratively, motional artifacts will be produced if the desired voxel 10v moves a sufficient distance in any direction (here limited, for purposes of illustration, to the Y direction) such that more than a preselected amount (e.g. 50%) of adjacent voxels $10v'$ and/or $10v''$ become located in the absolute volume defining the desired volume element.

As shown in FIG. 2A, acquisition of a spectrum by the prior-art volume selective excitation (VSE) method commences, at a time $t_O$, with the localization subsequence, in which a first magnetic field gradient (such as the $G_X$ gradient with some amplitude, e.g. $+2$) is applied in a first direction (here, parallel to the X axis). The amplitude and polarity of this first gradient are selected to differentiate a first plane passing through the desired voxel. While the first spatial gradient 11 is present with non-zero value, an X-dimension selection RF signal portion 12 occurs with: a first selective 45° RF signal pulse 12a, commencing at time $t_1$; a broadband (non-selective) 90° RF signal pulse 12b, commencing at time $t_2$; and a terminating second selective 45° RF signal pulse 12c, commencing at time $t_3$ and terminating at time $t_4$, prior to the termination of the first direction gradient at time $t_5$. A plane in a second dimension, substantially orthogonal to the first dimension and also passing through the desired voxel, is excited by the application of a second gradient pulse 14 (here in the $G_Y$ direction with a plane-designation amplitude value, e.g. $-1$) and a subsequent RF selection signal portion 15. Thus, shortly after the application, at time $t_5$, of the second direction gradient pulse 14, the second (Y) direction RF triple pulse portion 15 provides: a selective $\pi/4$ RF signal pulse 15a commencing at time $t_6$; a non-selective $\pi/2$ RF signal pulse 15b commencing at time $t_7$; and a final $\pi/4$ selective RF signal pulse 15c commencing at time $t_8$ and terminating at time $t_9$, prior to the termination of the second gradient portion 14 at time $t_a$. Thereafter, spatial localization in the third plane, substantially orthogonal to the first two planes, occurs and fully localizes the desired voxel in all three spatial dimensions. Thus, a third gradient (the Z-axis gradient $G_Z$, with a Z-plane value, e.g. $+1$) portion 17 is provided, starting at time $t_a$; another triple-pulse RF signal portion follows, with its first $\pi/4$ selective RF signal pulse 18a commencing at time $t_b$, followed by a non-selective $\pi/4$ RF signal pulse 18b commencing at time $t_c$, and ending with a final $\pi/4$ selective RF signal pulse 18c commencing at time $t_d$ and ending at time $t_e$, prior to the time $t_f$ at which the third directional gradient portion 17 ends. For convenience, this entire three-dimensional localization subsequence, from time $t_O$ to time $t_f$, is referred to as the VSE localization subsequence. At some time $t_g$ after the VSE localization subsequence terminates, a response readout (or data acquisition) subsequence commences, and the NMR response signal, evoked from the non-localized voxel, is acquired. This readout subsequence commences with a non-selective $\pi/2$ RF signal pulse 20, present from time $t_g$ to time $t_h$; thereafter, the NMR spectrometer receiver data gate is opened (illustrated by gate open portion 22) so that the response signal 24 is received and properly processed, in a different manner well known to the art. Thus, the VSE procedure requires a subsequence with three consecutive localizations, each in a different one of a trio of crossing planes, prior to a readout subsequence which commences with a non-selective, volume-irradiating readout pulse 20.

Referring now to FIG. 2B, in accordance with one presently preferred embodiment of the present invention, an improved volume excitation-selective spectroscopic sequence (IVES) utilizes: (1) a localization subsequence in which localization planes in only a pair of orthogonal directions are established; and (2) a subsequent readout subsequence with a spatially TM selective NMR pulse to provide localization in the third orthogonal direction. Here, the two-dimensional localization subsequence, which commences at time $t_O$ and terminates at time $t_a$, utilizes first and second dimension gradient portions 11 and 14 and associated RF signal pulse portions 12a–12c and 15a–15c, identical to those portions utilized in the normal VSE procedure of FIG. 2a. The third-dimension-localization readout subsequence uses a third dimension $G_Z$ gradient portion 26a, present from a time $t_a$ to a new time $t_d'$, during which time a $\pi/2$ RF signal pulse 28 is present from a commencement time $t_b'$, after gradient commencement time $t_a$, to a termination time $t_c'$, itself prior to the $G_Z$ gradient pulse termination time $t_d'$. Advantageously, to limit the voxel Z direction length 10z, RF pulse 28 is of the truncated sinc form, as now well known to the art. After the termination of gradient portion 26a, a rephasing gradient portion 26b is provided in the time interval from time $t_d'$ to time $t_f'$, with duration and amplitude such that the area of pulse 26b is substantially one-half the area of pulse 26a; the response gate is enabled when gating signal 22' occurs between time $t_e'$ and time $t_g'$ and the NMR response signal 24' is acquired substantially only from the desired voxel $10v$ now localized in all three dimensions.

The prior art SPARS method, shown in FIG. 3A, commences with its localization subsequence, from time $t_o$ to time $t_u$. In the SPARS localization subsequence a first, non-selective $\pi/2$ RF signal pulse 31a occurs (between $t_1$ and $t_2$) before a pulse 32a of the gradient in the desired localization direction (e.g. the $G_X$ gradient in the X direction) is provided, from time $t_3$ until time $t_4$. Thereafter, a non-selective $\pi$ RF signal pulse 31b occurs between times $t_5$ and $t_6$. Localization in the first (e.g. X) direction terminations with a selective $\pi/2$ pulse, provided by a $\pi/2$ RF signal 31c (here of the sinc form) occurring in a time interval (from time $t_8$ to time $t_9$) within the time interval (from time $t_7$ to time $t_a$) during which a gradient pulse 32b is present in the desired (X) first direction. For localization in the associated second (Y) or third (Z) direction, the sequence is repeated: thus, a non-selective $\pi/2$ RF pulse (24a or 37a), is followed by a gradient pulse (35a or 38a), in the desired direction; after the gradient pulse ends, a non-selective $\pi$ RF pulse (34b or 37b) is provided, before a spatially-selective $\pi/2$ RF pulse (with sinc RF signal portions 34c or 37c occurring simultaneous with an associated gradient portion 35b or 38b) is provided. The localization procedure ends at time $t_u$, when the third direction gradient ($G_Z$) pulse 38b terminates. The data acquisition subsequence follows thereafter, with a non-spatially-selective $\pi/2$ RF signal pulse 40 (from time $t_v$ to time $t_x$) evoking a NMR response signal from the localized voxel. The receiver data gate 42 is open from time $t_w$ through time $t_y$, to allow acquisition of response signal 44.

Referring now to FIG. 3B, in accordance with another presently preferred embodiment of the present invention, an improved SPARS sequence (ISPARS) utilizes a localization subsequence in which localization planes in only a pair of first and second (e.g. X and Y) directions are established, with that portion of the SPARS sequence from time $t_O$ through time $t_k$. A third-dimension-localizing readout subsequence follows, commencing at time $t_k$; a readout $\pi/2$ RF signal pulse 48, which is spatially selective in the third (here, Z) direction, occurs (from time $t_1'$ to time $t_m'$) while a third direction gradient $G_Z$ portion 46a is present (from time $t_k$ to time $t_n'$). A rephasing gradient portion 46b is provided in the time interval from time $t_n'$ to time $t_p'$, with the response gate signal 42' being enabled between time $t_0'$ and time $t_q'$, so that the response signal 44' is acquired substantially only from the desired voxel 10v, now again localized in all three Cartesian dimensions.

Figure 4A:
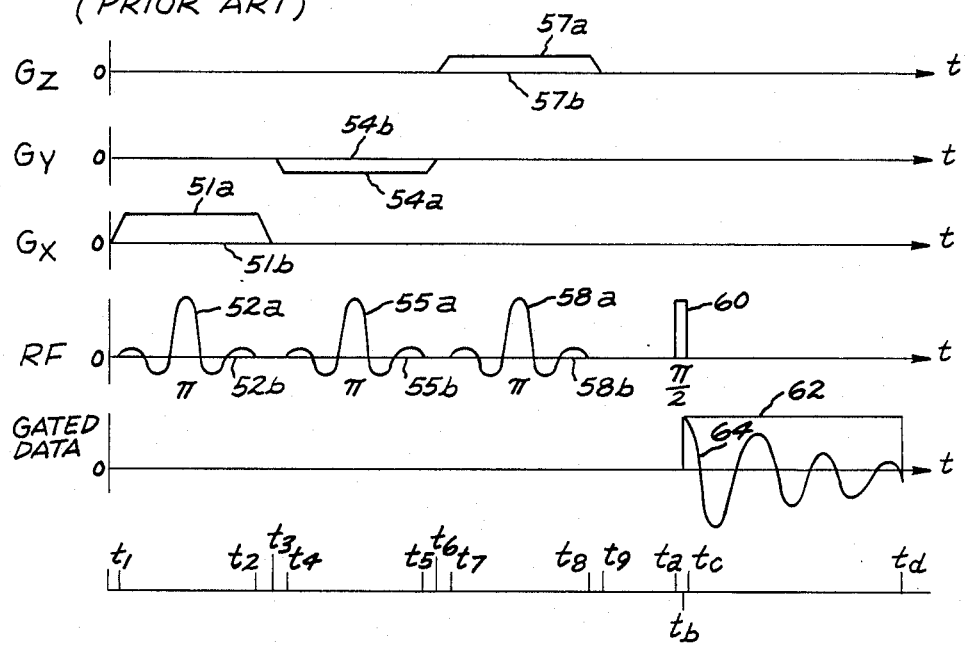

The ISIS prior art sequence of FIG. 4A has a localization subsequence of three spatially-selective (inverting) $\pi$ RF signal pulses, each in a different Cartesian direction. Thus, localized inversion in the first (X) direction is carried out by impressing upon the sample a gradient $G_X$ pulse 51 in that direction, while a $\pi$ RF signal pulse 52a excites the sample; no localization in this (X) direction occurs (the selection is OFF) if the gradient has a substantially zero amplitude, or if the RF pulse has a substantially zero amplitude, as in RF portion 52b. Similarly, in the second (Y) direction or in the third (Z) direction, one of $G_Y$ pulse 54a or $G_Z$ pulse 57a occurs while the associated one of a $\pi$ RF signal pulse 55a or 58a is present. Again, no localization in the associated second or third (Y or Z) direction occurs if that associated (Y or Z) gradient or $\pi$ RF signal pulse has a substantially zero amplitude, as in RF portion 55b or RF portion 58b. The localization subsequence ends at time $t_9$, when the signal acquisition subsequence commences. As in the other prior art procedures, the readout subsequence utilizes a non-spatially-selective $\pi/2$ RF signal pulse 60, with the receiver data gate 62 being enabled to acquire the voxel response signal 64. Eight different sequences are applied to the sample, with all ON and OFF combinations of the three $\pi$ RF pulses (or corresponding field gradient portions 51b,/54b/57b), and with the resulting data for that sequence being added to (+1) or subtracted from (-1) the total of the data of the previous sequences, in accordance with the following table:

| SEQUENCE | X | Y | Z | TOTAL SPECTRAL CONTRIBUTION |
|---|---|---|---|---|
| 1 | OFF | OFF | OFF | +1 |
| 2 | ON | OFF | OFF | -1 |
| 3 | OFF | ON | OFF | -1 |
| 4 | ON | ON | OFF | +1 |
| 5 | OFF | OFF | ON | -1 |
| 6 | ON | OFF | ON | +1 |
| 7 | OFF | ON | ON | +1 |
| 8 | ON | ON | ON | -1 |

That is, a $\pi$ RF inversion pulse (or gradient pulse) producing selective inversion in the respective X, Y or Z direction is ON if the respective non-zero-amplitude X, Y or Z selective RF portion 52a, 55a or 58a is present, while that direction pulse is OFF if the substantially-zero-amplitude RF pulse 52b, 55b or 58b is present, each cotemporally with the associated gradient pulse 51a, 54a or 57a.

Figure 4B:
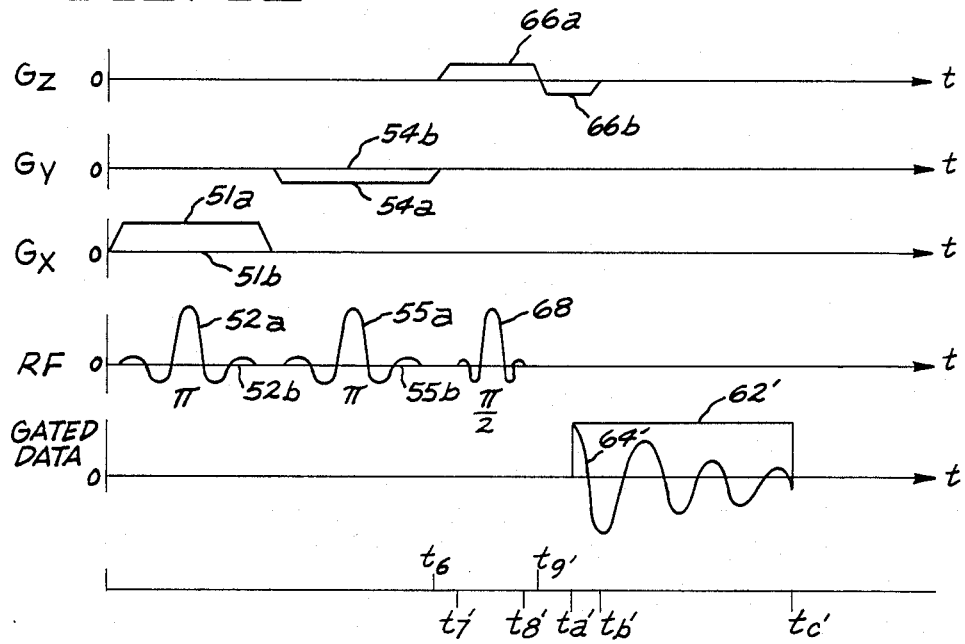

In accordance with another presently preferred embodiment of the present invention, an improved contracted ISIS sequence (CRISIS), as shown in FIG. 4B, utilizes a preliminary localization subsequence in which only two intersecting localization planes are established in the time interval from time $t_0$ to time $t_6$. A subsequent readout subsequence, from time $t_6$ to time $t_c'$, spatially selects the third-dimensional extent of the voxel from which a response is desired. The response acquisition subsequence thus begins with a (Z) spatially-selective $\pi/2$ pulse, comprised of a third-dimension (Z axis) field gradient ($G_z$) pulse 66a from time $t_6$ to time $t_9'$, during which interval a $\pi/2$ RF signal pulse 68 (here, of sinc form) occurs from time $t_7'$ to time $t_8'$. A rephasing lobe 66b of the third gradient then is provided, from time $t_9'$ to time $t_b'$; the response gate signal 62' occurs from time $t_a'$ to time $t_c'$, during which the localized spectroscopy response signal 64' is received. It will be seen that this sequence has both the X and Y selective inversion pulses in the ON condition; three additional sequences will be provided, with the remaining combinations of one or both of X and Y RF pulses or the gradients $G_x$ and $G_y$ in the OFF condition (responsive to respective RF portions 52b or 53b, or respective gradient portions 51b or 54b), in accordance with the following table:

| SEQUENCE | X | Y | TOTAL SPECTRAL CONTRIBUTION |
|---|---|---|---|
| 1 | OFF | OFF | +1 |
| 2 | ON | OFF | -1 |
| 3 | OFF | ON | -1 |
| 4 | ON | ON | +1 |

There are, three advantages of the improved CRISIS, IVES and ISPARS techniques with respect to ISIS, VSE and SPARS. First, it will be seen that the CRISIS, IVES and ISPARS sequences are typically only two-thirds the duration of the ISIS, VSE and SPARS localization subsequences. Since the number of applied RF signal pulses has been reduced by one-third, the RF signal power deposited in the sample is also reduced by about one-third. Secondly, the number (e.g. 4) of sequence cycle required for localization is only one-half that number (e.g. 8) required for ISIS, cycled VSE or cycled SPARS localization. Since the total sequence cycle time is thus at least 50% shorter than in conventional ISIS, cycled VSE or cycled SPARS, the opportunity for production of artifacts by physiological motion is similarly reduced. Third, since the inventive procedures effectively contracts the localization procedure by one dimension and the read-out pulse selectively excites only a plane of the sample (which need not always be the Z-axis direction, chosen here for illustrative purposes only) rather than a non-selective excitation of the entire sample, any $T_1$ relaxation artifacts, as well as motional artifacts, are significantly reduced by the ratio of the slice thickness to the total dimension of the sample, in that third dimension.

While several presently preferred embodiments of my novel method have been presented herein by way of explanation, many variations and modifications will now become apparent to those skilled in the art. It is my intent, therefore, to be limited only by the scope of the appended claims.

What I claim is:

1. A method for acquiring, with a reduced sensitivity to localization artifacts, an NMR spectroscopy response signal from a portion of a sample in a desired voxel located at the intersection of three different surfaces, comprising the steps of:

(a) immersing the sample in a static magnetic field $B_0$;
   (b) exciting nuclear magnetic resonance in the sample with a localization subsequence which selectively differentiates NMR signals in only two of the three surfaces; and (c) then providing a readout subsequence which is spatially selective for NMR in the sample on the remaining surface and which occurs immediately prior to the commencement of acquisition of an NMR response signal from the desired voxel.

2. The method of claim 1, wherein step (c) comprising the steps of: (c1) generating within the sample a magnetic field gradient to select a desired spatial surface passing through the desired voxel; and (c2) generating at least in the sample, cotemporally with the presence of the gradient of step (c1), a radio-frequency (RF) magnetic field signal nutating the spins substantially by 90° in the desired voxel.

3. The method of claim 2, wherein step (c1) comprises the steps of: generating the gradient in a direction of spatial selection parallel to a desired axis of a Cartesian coordinate system; and assigning to the gradient an amplitude selected to position the gradient through the desired voxel.

4. The method of claim 3, wherein the gradient generating step includes the step of assigning the desired axis to be substantially parallel to the direction of the static magnetic field $B_o$.

5. The method of claim 4, wherein the desired axis is in the Z direction.

6. The method of claim 5, wherein step (b) includes the step of localizing the limits of the desired voxel only in the two directions parallel to the remaining two Cartesian axes.

7. The method of claim 6, wherein the two localization subsequence surfaces are planes, respectively in the X and Y directions.

8. The method of claim 2, further comprising the step (c3) of generating, after termination of the 90° RF signal, a rephasing pulse of the magnetic field gradient of step (c1).

9. The method of claim 2, wherein the RF signal has an envelope with substantially a sinc function shape.

10. The method of claim 9, wherein the sinc function is truncated to a selected number of lobes.

11. The method of claim 1, wherein step (b) includes the steps of: generating a first magnetic field gradient to define the first surface; while the sample is subjected to the first gradient, generating a RF magnetic field signal to sequentially nutate spins in the desired voxel substantially by 45°, 90° and 45°; then generating a second magnetic field gradient to define the second surface; and, while the sample is subjected to the second gradient, generating another RF magnetic field signal to sequentially nutate spins in the desired voxel substantially by 45°, 90° and 45°.

12. The method of claim 1, wherein step (b) includes the steps of (b1) defining the first surface by sequentially performing the steps of: (b1a) generating a first RF magnetic field signal to nutate spins in the sample substantially by 90°; (b1b) then generating a first pulse of a first magnetic field gradient defining the first surface; (b1c) then generating a second RF magnetic field signal to nutate spins in the sample substantially by 180°; (b1d) and then generating a first spatially-selective signal for nutating spins along the first surface substantially by 90°; and (b2) then defining the second surface by sequentially performing the steps of: (b2a) generating a third RF magnetic field signal to nutate spins in the sample substantially by 90°; (b2b) then generating a first pulse of a second magnetic field gradient defining the second surface; (b2c) then generating a fourth RF magnetic field signal to nutate spins in the sample substantially by 180°; (b2d) and then generating a second spatially-selective signal for nutating spins along the second surface substantially by 90°.

13. The method of claim 1, wherein step (b) includes the steps of: (b1) generating a first spatially-selective signal for inverting the spins in the sample along the first surface; and (b2) generating a second spatially-selective signal for inverting the spins in the sample along the second surface.

14. The method of claim 13, wherein step (b1) includes the steps of: generating a first magnetic field gradient to define the first surface; and, while the sample is subjected to the first gradient, generating a RF magnetic field signal to nutate spins in the desired voxel substantially by 180°.

15. The method of claim 14, wherein step (b2) includes the steps of: generating a second magnetic field gradient to define the second surface; and, while the sample is subjected to the second gradient, generating another RF magnetic field signal to nutate spins in the desired voxel substantially by 180°.

16. The method of claim 13, wherein step (b) further includes the step of (b3) repeatedly applying the first and second spin-inverting spatially-selective signals with all combinations of these first and second signals being present or absent; and step (c) further includes the steps of: (c1) acquiring a different NMR response signal after each application of each different combination of the first and second signal of step (b3); and (c2) adding and subtracting the different NMR response signals acquired if step (c1), to produce a final signal substantially localized to the desired voxel.

17. An improved method for reduction of localization artifact effects in a NMR sequence of the type for acquiring a spectroscopy response signal from a portion of a sample in a desired voxel, with the NMR sequence consisting of (1) a first spatially-localizing subsequence for causing spatial differentiation in at least one dimension, and (2) a subsequent second non-selective NMR read-out subsequence, the improvement comprising the steps of:
(a) deleting a spatial differentiation portion of the first subsequence for one selected spatial dimension;
(b) replacing the second non-selective NMR readout subsequence with an NMR read-out subsequence providing spatial localization in the one selected spatial dimension; and
(c) processing the resulting NMR read-out response signal to produce a spectroscopy response signal substantially spatially-localized to the desired voxel.

18. The method of claim 17, wherein step (b) comprising the steps of (b1) generating within the sample a magnetic field gradient to select a desired spatial surface passing through the desired voxel; and (b2) generating at least in the sample, cotemporally with the presence of the gradient of step (b1), a radio-frequency (RF) magnetic field signal nutating the spins substantially by 90° in the desired voxel.

19. The method of claim 18, wherein step (b1) comprises the steps of: generating the gradient in a direction of spatial selection parallel to a desired axis of a Cartesian coordinate system; and assigning to the gradient an amplitude selected to position the gradient through the desired voxel.

20. The method of claim 19, wherein the gradient generating step includes the step of assigning the desired axis to be substantially parallel to the direction of the static magnetic field $B_o$.

21. The method of claim 20, wherein the desired axis is in the Z direction.

22. The method of claim 18, further comprising the step (c3) of generating, after termination of the 90° RF signal, a rephasing pulse of the magnetic field gradient of step (c1).

23. The method of claim 18, wherein the RF signal has an envelope with substantially a sinc function shape.

24. The method of claim 23, wherein the sinc function is truncated to a selected number of lobes.

25. The method of claim 18, wherein the RF signal has an envelope with substantially a Gaussian function shape.

26. The method of claim 17, further comprising the step of cyclically repeating steps (b)–(c) with variation of spatial differentiation in the remaining spatial dimensions.

27. The method of claim 26, wherein step (c) includes the step of adding and subtracting the spectroscopy response signals from a complete cycle, to produce a total spectroscopy response signal substantially only from the desired voxel.

* * * * *